US005150192A

United States Patent [19]

Greene et al.

[11] Patent Number: 5,150,192

[45] Date of Patent: Sep. 22, 1992

[54] FIELD EMITTER ARRAY

[75] Inventors: Richard F. Greene, Charlotte, N.C.; Henry F. Gray, Alexandria, Va.

[73] Assignee: The United States of America as represented by the Secretary of the Navy, Washington, D.C.

[21] Appl. No.: 718,034

[22] Filed: Jun. 20, 1991

Related U.S. Application Data

[62] Division of Ser. No. 589,102, Sep. 27, 1990, Pat. No. 5,057,047.

[51] Int. Cl.[5] ...................... H01L 23/48; H01L 29/44

[52] U.S. Cl. ........................................ 357/68; 357/55; 357/52; 357/31; 357/32; 313/309; 313/366

[58] Field of Search ....................... 357/55, 65, 68, 31, 357/32, 52; 437/225, 228; 313/309, 366

[56] References Cited

U.S. PATENT DOCUMENTS

| | | | |
|---|---|---|---|
| 3,171,762 | 3/1965 | Rutz | 148/175 |
| 3,755,704 | 8/1973 | Spindt et al. | 313/309 |
| 3,814,968 | 6/1974 | Nathanson et al. | 357/31 |
| 3,894,332 | 7/1975 | Nathanson et al. | 357/31 |
| 4,307,507 | 12/1981 | Gray et al. | 437/228 |
| 4,513,308 | 4/1985 | Greene et al. | 357/32 |
| 4,596,069 | 6/1986 | Bayraktaroglu | 29/571 |
| 4,685,996 | 8/1987 | Busta et al. | 437/225 |
| 5,047,830 | 9/1991 | Grabbe | 357/79 |

*Primary Examiner*—Rolf Hille
*Assistant Examiner*—David Ostrowski
*Attorney, Agent, or Firm*—Thomas E. McDonnell; George Jameson

[57] ABSTRACT

A field emitter structure is disclosed which comprises: a substrate selected from the group consisting of a semi-insulating substrate and an insulating substrate, the substrate having first and second surfaces and at least one hole therethrough; a first conducting layer disposed on the first surface of the substrate and having at least one aperture aligned with an associated at least one hole in the substrate, the at least one aperture of the first conducting layer comprising an extraction electrode; and a second conducting layer disposed on the second surface and projecting into the at least one hole in the substrate and into the at least one associated aperture of the first conducting layer and forming at least one associated apex inside the at least one hole, the at least one associated apex comprising an associated electron field emitter. In a second embodiment of the invention, a conducting substrate is substituted for the insulating or semi-insulating substrate, a first insulating layer is disposed between the first surface of the conducting substrate and the first conducting layer, and the second conducting layer disposed on the second surface also projects through at least one associated aperture of the first insulating later.

7 Claims, 5 Drawing Sheets

FIELD EMITTER ARRAY

This is a division of co-pending application Ser. No. 07/589,102, filed on Sep. 27, 1990, now U.S. Pat. No. 5,057,047.

FIELD OF THE INVENTION

The present invention relates generally to field emitter arrays and methods for manufacturing same. More specifically, the present invention relates to field emitter arrays and methods of manufacture using semi-insulating gallium-arsenide (GaAs) to form a low capacitance insulation region between the gate electrode and the field emitters.

BACKGROUND OF THE INVENTION

A field emitter array generally comprises two closely spaced surfaces. The first, an emitter surface, has a plurality of pyramid-like projections which are generally perpendicular to the surface. The second, a gate surface, is a conductive layer substantially parallel to and insulated from the first surface. The gate surface normally has a plurality of apertures disposed above the tips of the emitter projections so that electrons emitted from these tips pass through the apertures when the gate surface is positively biased with respect to the emitter tips. The separation between the emitter tips and the gate surface is generally on the order of about one micron so that low potentials between the two surfaces induce large electron currents.

Field emitter arrays are used in many electron devices due to their inherent advantages over thermionic cathodes, including: (a) higher emission currents; (b) lower power requirements; (c) less expensive fabrication costs; and (d) ease of integration with other circuitry. Despite these advantages, the use of field emitter arrays in high frequency devices is limited by two requirements. First, obtaining the desired magnitude of emitter current and electron energy at the selected operating frequency requires that the geometry of both the emitter tip shape and the apertures be precisely defined. Second, the capacitance of the insulating layer must be low in order to produce a device with high input impedance at high frequency operation. Previously known field emitter array structures and manufacturing techniques have achieved only limited success in satisfying these two requirements.

For example, it is known how to fabricate field emitter arrays using silicon dioxide ($SiO_2$) as the insulating layer, since it is easily fabricated using conventional deposition techniques or can be thermally grown on a substrate. U.S. Pat. Nos. 4,513,308 and 3,755,704 disclose examples of such fabrication techniques. The '308 patent discloses deposition of $SiO_2$ to a thickness of about 1–4 microns, which results in a relatively high capacitance between the two surfaces. The '708 patent discloses a thin insulating layer having a thickness of about 0.5–2 microns. Because the insulating layer thickness is limited in order to ensure that small apertures are formed, the thinness of the insulating layer results in a high capacitance structure. In addition, such thin insulating layers are subject to pin-hole defects which can lead to early failure of the field emitter array. Thus, conventional $SiO_2$ deposition techniques limit the frequency range of the field emitter array and can limit the mean time between failure.

U.S. Pat. No. 4,307,507 discloses a method for forming a plurality of sharp cathode tips by orientation-dependent-etching a plurality of holes in a substrate such as <100> oriented silicon, filling the holes with a suitable conducting material, and removing the "mold" substrate. This method allows formation of crystallographically sharp emitter tips but, because conventional deposition techniques are used to deposit the insulator and gate metallization layers after the mold is removed, the final structure still has a relatively low impedance at frequencies above, for example, one megahertz (1 MHz).

Heretofore, field emitter array structures using semi-insulating GaAs as a thick uniform insulating layer have not been produced.

SUMMARY OF THE INVENTION

Accordingly, one object of the present invention is to provide an improved field emitter array having high input impedances at frequencies above, for example, 1 MHz and a method for manufacturing same.

A further object is to provide an improved high frequency field emitter array and a method for manufacturing same.

Another object is to provide an improved field emitter array which is less susceptible to electrical breakdown.

Another object is to provide an improved method for fabricating field emitter arrays at a lower cost by minimizing the number of conventional masking and developing steps used in the fabrication process.

Another object is to provide an improved method for fabricating field emitter arrays at a lower cost by using fabrication steps which are self-aligning.

Still another object is to provide an improved method for fabricating field emitter arrays responsive to predetermined voltage ranges.

These and other objects and advantages are achieved in accordance with the present invention by a method for manufacturing a field emitter structure, the method comprising the steps of: selecting a substrate made of an insulating material; forming in a first side of the substrate at least one hole having a predetermined configuration; depositing a first conducting layer into the at least one hole so as to form at least one structure; etching a second side of the substrate opposing the first side until a portion of the first conducting layer in the at least one hole is exposed; depositing a second conducting layer on the second side of the substrate; removing a first predetermined portion of the second conducting layer overlying the exposed portion of the first conducting layer; removing an additional second predetermined portion of the second conducting layer adjacent to the at least one structure so as to form an associated gate aperture insulated from the at least one structure; and removing a portion of the substrate so as to expose a predetermined portion of the first conducting layer forming said at least one structure beneath said gate aperture.

These and other objects and advantages are achieved according to a first embodiment of the present invention by a field emitter array produced by providing a substrate of a single crystal material with a pattern of exposed substrate and a non-reactive material on a first surface; orientation-dependent-etching the exposed substrate to produce a hole with sides intersecting at a crystallographically sharp apex; and depositing a first conducting layer on both the first surface and the interior surface of the hole. A gate is formed by etching a second surface of the substrate to expose a first portion of the first conducting layer; depositing an etch stop layer and a second conducting layer on the second surface; depositing a planarization layer on the second conducting layer; etching the planarization layer, the second conducting layer and the etch stop layer to expose a second portion of the first conducting layer; and undercutting the planarization layer, the second conducting layer, the etch stop layer and the substrate to expose a third portion of the first conducting layer. The resultant structure incorporates the low capacitance inherent in the thick semi-insulating GaAs "mold."

According to a second embodiment of the present invention, a field emitter array is produced by providing a substrate of a single crystal material with a pattern of exposed substrate and a non-reactive material on a first surface; orientation-dependent-etching the exposed substrate to produce a hole with sides intersecting at a crystallographically sharp apex; and depositing a first conducting layer on both the first surface and the interior surface of the hole. A gate is formed by etching a second surface of the substrate to expose a first portion of the first conducting layer; depositing a second conducting layer on the second surface; depositing a planarization layer on the second conducting layer; etching the planarization layer and the second conducting layer to expose a second portion of the first conducting layer; and undercutting the planarization layer, the second conducting layer, and the substrate to expose a third portion of the first conducting layer. The resultant structure incorporates the low capacitance inherent in the thick semi-insulating GaAs "mold" without incorporating an etch stop layer in the structure. It will be appreciated that the first and second conducting layers in the second embodiment must be differentiated from one another so that etching steps for removing selected portions of the planarization layer and second conducting layer do not remove portions of the first conducting layer.

These and other objects, features and advantages of the invention are disclosed in or apparent from the following description of preferred embodiments.

BRIEF DESCRIPTION OF THE DRAWING

These and other features and advantages of the present invention are disclosed in or apparent from the following detailed description of preferred embodiments. The preferred embodiments are described with reference to the drawing, in which.

DESCRIPTION OF THE PREFERRED EMBODIMENTS

FIGS. 1–8 show intermediate structures formed during the various fabrication steps according to a first embodiment of the present invention, described in detail below. Although only one emitter-gate structure is shown in the figures for the sake of clarity, a plurality of field emitter sites can be formed during the manufacturing process to produce a resultant structure of a field emitter array.

Fabrication in accordance with a first embodiment of the present invention begins with a substrate 10 of a single crystal material having a crystal orientation such that the underlying crystal structure is properly oriented for orientation-dependent-etching. Preferably, the substrate 10 material is <100> oriented, semi-insulating GaAs, both because of its intrinsic properties, e.g., low dielectric constant, and because of the broad array of fabrication techniques which have been developed for GaAs. Other materials from the Group III–V semiconductor compounds, such as indium phosphide (InP) and gallium phosphide (GaP), advantageously are also suitable as the material of substrate 10.

Figure 1:
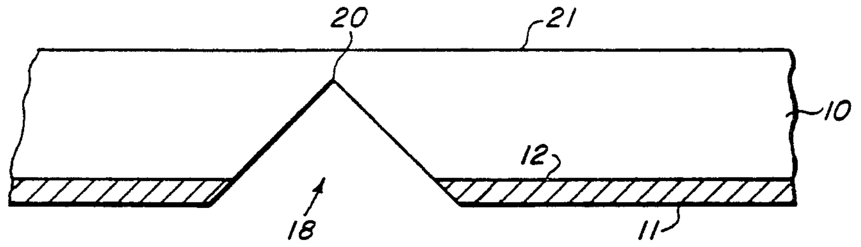
FIGS. 1–8 schematically illustrate the steps of fabricating one emitter and associated gate of a field emitter array in accordance with a first embodiment of the present invention.

The first fabrication step is to deposit a non-reactive mask 11 on a first surface 12 of substrate 10 by any conventional method so as to produce a predetermined pattern of exposed substrate 10 and non-reactive material. Substrate surface 12 is then etched using conventional orientation-dependent-etching techniques to form a hole 18 having a sharp apex 20. The resultant structure is shown in FIG. 1. In this first embodiment, the distance from the sharp apex 20 to a second surface 21 of substrate 10 is about 1 micrometer ($\mu$m).

As will be appreciated by those skilled in the art, orientation-dependent-etching refers to etching in one crystal direction but not in another crystal direction. For example, an etch such as $H_2SO_4$:$H_2O_2$:$H_2O$ may be used to preferentially attack the <100> planes of the substrate material. The etchant will attack the crystal structure at a rapid rate until <111> planes are encountered, at which time etching stops, or proceeds at a significantly reduced rate. This etching action produces a pyramidally shaped hole 18, the <111> sides of which intersect at an apex 20 which is crystallographically sharp. The orientation-dependent-etching process results in uniformly sharp apices 20 even though the etching time may vary from one hole 18 to another hole 18 in a plurality of such holes 18. Other orientation-dependent-etching etchants can be used without departing from the present invention. For example, chemical etchants such as $Br_2CH_2OH$, and formulations based on HCl, $K_3Fe(CN)_6$, $Ce(SO_4)_2$, or $KMnO_4$ may be used. In addition, any one of a variety of gas phase and/or plasma orientation-dependent-etching process may also be used.

It will be appreciated that the removal of semi-insulating (or insulating) material is not limited to orientation-dependent-etching (ODE), particularly to the ODE of <100> surfaces. Material removal advantageously can be by any chemical or physical etching process, such as directional ion sputtering or ion milling, photo-stimulated wet etching by using a directed laser, ODE etching of the <110> surface to yield "fence structures", etc. That is, any removal method can be used to provide a suitably shaped conductive field emitter. In fact, structure sharpening can be performed after the field emitter array structure has been formed, as discussed in greater detail below.

Figure 2:
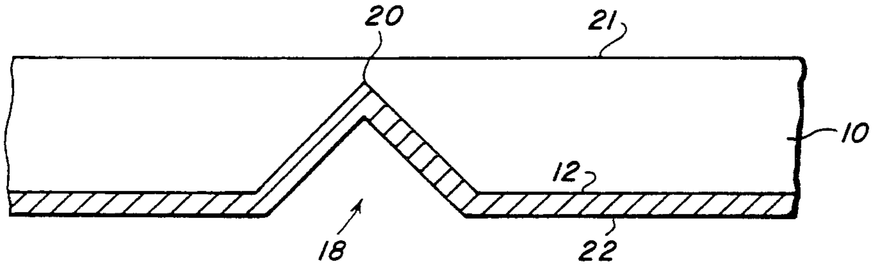

Following formation of hole(s) 18, the mask 11 is removed using suitable conventional removal techniques. Chemical vapor deposition (CVD) techniques or other deposition processes, i.e., sputtering or thermal evaporation, are then used to deposit a first conducting layer 22 onto surface 12 of substrate 10 and the inside of hole 18. The resultant structure is shown in FIG. 2. First conducting layer 22 is preferably deposited to a thickness of about 1 μm.

Figure 3:
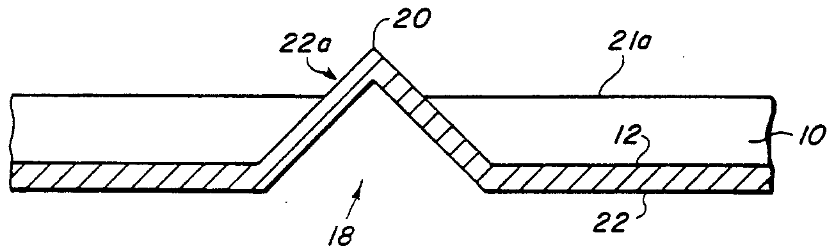

Fabrication then continues on a second surface 21 of substrate 10. Surface 21 is etched to a new second surface **21*a* (FIG. 3), using conventional techniques such as isotropic etching, planar plasma etching or reactive ion etching to decrease the thickness of substrate 10 and thus expose an external predetermined first portion 22*a* (FIG. 3) of first conducting layer 22, which lines hole 18. Portion 22*a* contains a sharp apex 20. The resultant structure is shown in FIG. 3. The exposed first portion 22*a* of first conducting layer 22 ultimately defines an aperture 30 of field emitter array 1 (see FIG. 9) and serves as an electron emitter 32 projecting through a bore 34 in the substrate 10 in the final structure (see FIGS. 8 and 9**).

Figure 4:
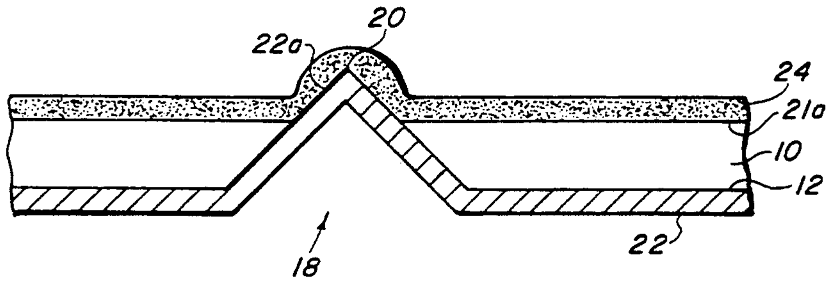
Figure 5:
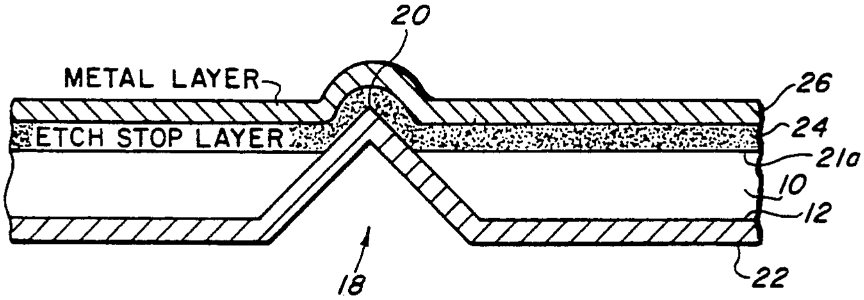

As shown in FIG. 4, a thin etch stop layer 24 is then deposited over second surface **21*a* of substrate 10 and first portion 22*a* until a desired thickness is obtained. Preferably, etch stop layer 24 is a material such as $SiO_2$ or $Si_3N_4$ with a thickness of about 0.1 μm. A second conducting layer 26 is then deposited to cover etch stop layer 24, as shown in FIG. 5. Second conducting layer 26 is preferably a material such as Mo, W, Ni or Si, although other materials such as Ti and SiC can advantageously be used. Preferably, second conducting layer 26 is deposited to a thickness of about 0.5 μm. It will be appreciated that etch stop layer 24 may be omitted if conducting layer 22 and conducting layer 26 are not removed by the same etching process. Second conducting layer 26 serves as the gate of field emitter array 1**.

Figure 6:
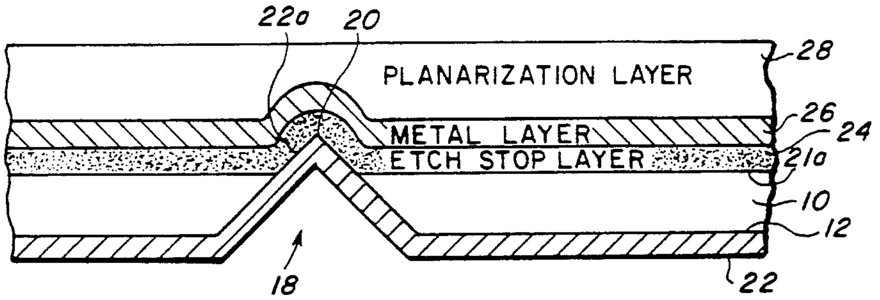

A planarization layer 28 is then deposited over second conducting layer 26, as shown in FIG. 6. Planarization layer 28 may be polyimide, spin-on or flowable glass, or other suitable protective material, which can be applied to a uniform depth over the entire second surface **21*a* of substrate 10**.

Figure 7:
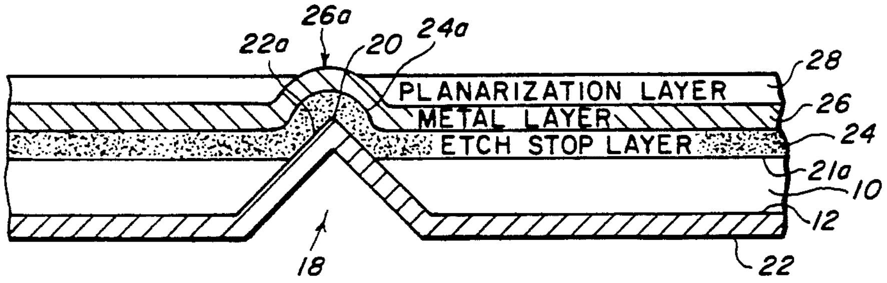

Planarization layer 28 is then etched to expose a portion **26*a* (FIG. 7) of conducting layer 26 corresponding to the portion 22*a* of first conducting layer 22 exposed during the first etching of second surface 21 of substrate 10. Any conventional etching technique, such as planar plasma etching, wet etching or reactive ion etching, may be used. The resultant structure is shown in FIG. 7**.

Figure 8:
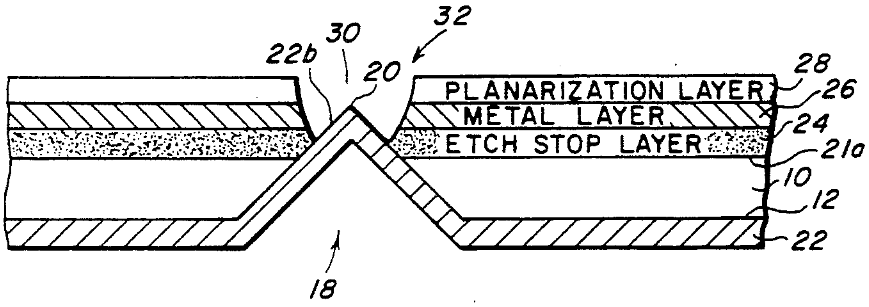

Selective etching is then performed to remove an exposed portion **26*a* of second conducting layer 26 and a portion 24*a* of the underlying etch stop layer 24 which lies on top of the exposed portion 22*a* of first conducting layer 22. This process produces an aperture 30 in second conducting layer 26 and an exposed second portion 22*b* of first conducting layer 22, as shown in FIG. 8**.

Figure 9:
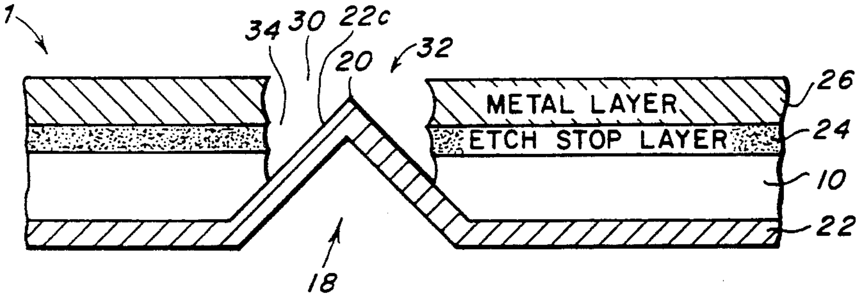
FIG. 9 schematically illustrates a completed emitter-gate cell structure of a field emitter array formed in accordance with the first embodiment of the present invention.

Further selective etching is then performed to remove a predetermined portion of etch stop layer 24, and substrate 10, thereby forming an insulative space 34 and exposing a predetermined third portion **22*c* of first conducting layer 22. The completed emitter-gate structure of field emitter array 1 is thus produced, as shown in FIG. 9**.

A field emitter array formed in accordance with the present invention can be produced with a low capacitance and resulting high input impedance at high frequency. Since the crystal orientation is known, controlling the depth of hole 18 is done by controlling the width or diameter of the exposed areas on first surface 12 of substrate 10 by means of mask 11. Thus, substrate 10 can be relatively thick, approximately 300 μm in the first preferred embodiment, which results in a low capacitance field emitter array while still producing sharp field emitters in field emitter array 1.

Figure 10:
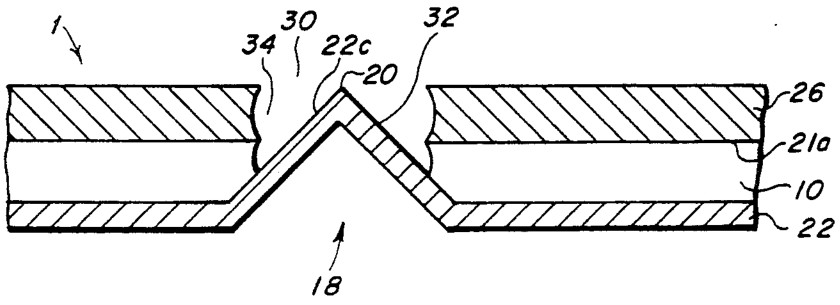
FIG. 10 schematically illustrates a completed emitter-gate cell structure of a field emitter array according to a second embodiment of the present invention.

According to a second embodiment of the present invention, the emitter-gate structure of field emitter array 1 is formed by the steps described above with the exception that etch stop layer 24 is not deposited on second surface **21*a* of substrate 10. In this embodiment, first conducting layer 22 and second conducting layer 26 advantageously are different from one another such that an etchant formulated to remove second conducting layer 26, or a process selected to remove portions of second conducting layer 26, does not remove any portion of first conducting layer 22. The resulting emitter-gate structure is shown in FIG. 10**.

It will be appreciated that first conducting layer 22 and second conducting layer 26 advantageously can be the same basic material so long as the deposited layers are differentiated from one another so that a selected etching process removes only portions **26*a* of the second conducting layers 26. Preferably, first conducting layer 22 is differentiated from second conducting layer 26** by ion doping, structural modification or defect formation.

Referring to FIGS. 11-18, a third embodiment of the method of the present invention is shown, schematically illustrating the resultant structure following each fabrication step.

Figure 11:
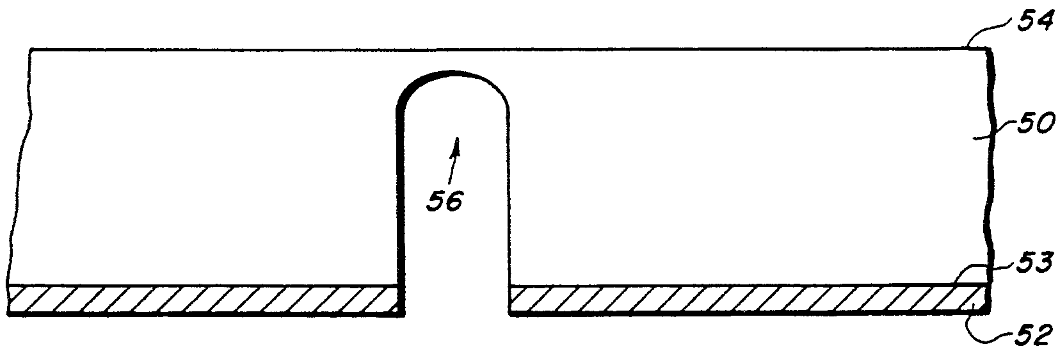
FIGS. 11–18 schematically illustrate the steps of fabricating one emitter-gate cell structure of a field emitter array according to a third embodiment of the present invention.

The first fabrication step is to deposit a non-reactive mask 52 on a first surface 53 of a substrate 50. Preferably, substrate 50 is composed of an insulative material, e.g. $SiO_2$, $Si_3N_4$ or $Al_2O_3$, in the form of a flat slab having a thickness of, for example, 10-100 microns. Deposition of mask 52 advantageously can be performed using any deposition method providing a predetermined pattern of exposed substrate 50 and the non-reactive material of mask 52. Surface 53 is then etched so as to form at least one hole 56, which has a high depth-to-width ratio. Etching advantageously is performed using any convenient etching process, i.e., laser oblation, optically stimulated wet etching, anisotropic etching, ion milling, or a combination of conventional etching techniques. The distance from the bottom of hole 56 and a second surface 54 of substrate 50 is about 1 micron. The resultant structure is shown in FIG. 11.

Figure 12:
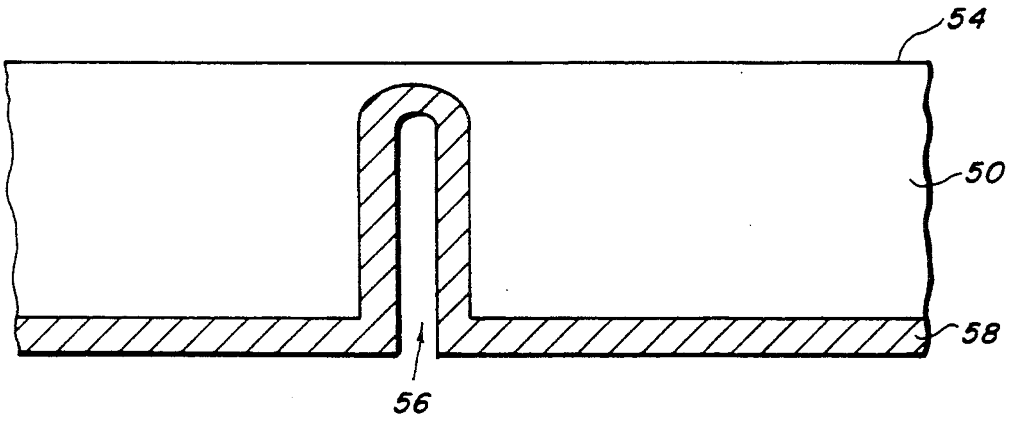
Figure 13:
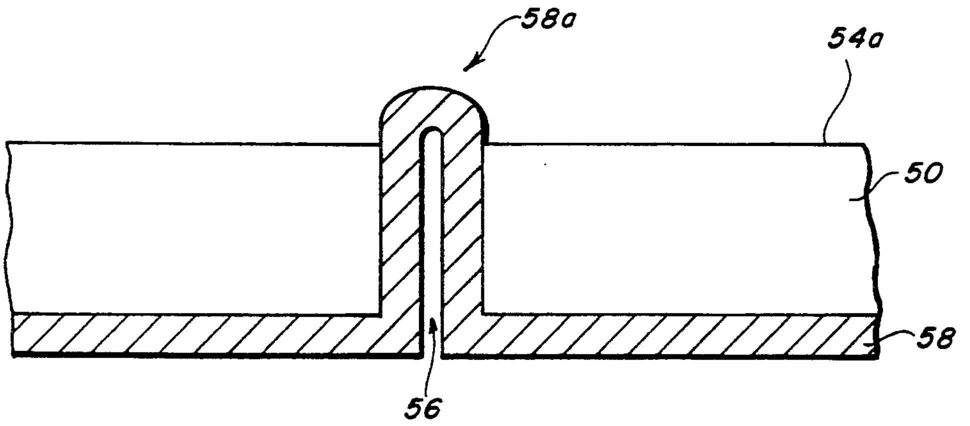
Figure 14:
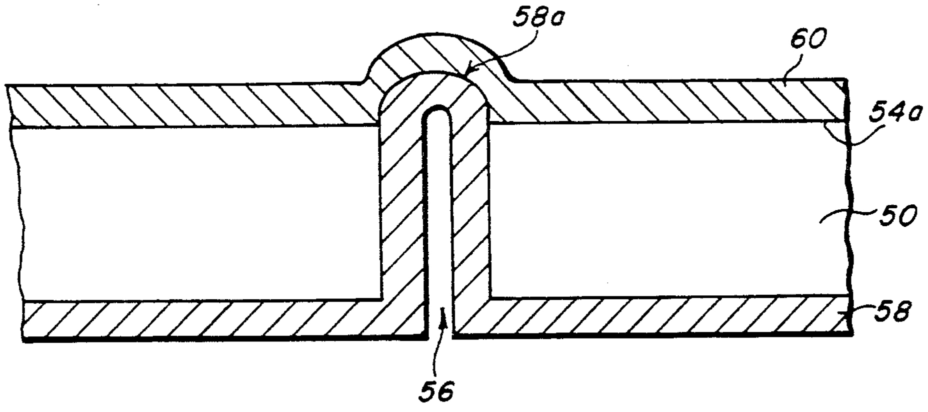

Following fabrication of hole 56, mask 52 is removed using a suitable removal technique. A first conducting layer 58 is then deposited onto surface 53 and into hole 56 to a predetermined thickness. Preferably, deposition is accomplished using, for example, chemical vapor deposition (CVD), physical evaporation or sputtering, or wet plating. The thickness of first conducting layer 58 advantageously is about 2 μm. The resultant structure is shown in FIG. 12.

Surface 54 of substrate 50 is then selectively etched using any appropriate etching process, i.e., reactive ion etching, planar plasma etching or isotropic etching, to decrease the thickness of substrate 50, form a new surface **54*a* and thus expose an external predetermined first portion 58*a* of layer 58. See FIG. 13**.

A second conducting layer 60 is then deposited onto portion 58*a* of layer 58 and surface 54*a*. Preferably, second conducting layer 60 is a material which can be etched by a process that does not etch the first portion 58*a* of layer 58. That is, layer 60 is composed of a material different from the material comprising layer 58. It will be appreciated that ion doping, defect formation or structural modification can be used to differentiate first portion 58*a* of layer 58 from layer 60 such that a single basic material can be used in all conducting layer formations. It will be further appreciated that an etch stop layer advantageously can be deposited prior to depositing layer 60, thus allowing layers 58 and 60 to be formed from a single material. See FIG. 14.

Figure 15:
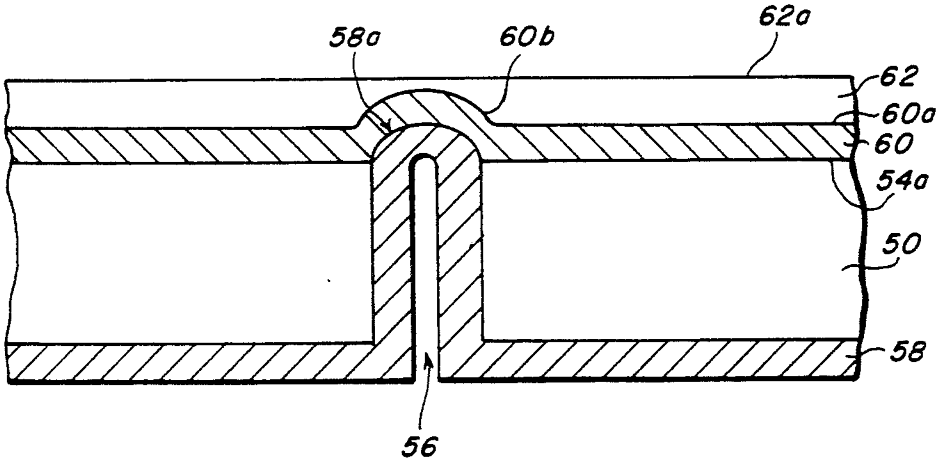

A planarization layer 62 is then deposited over layer 60, as shown in FIG. 15, such that a free surface 62*a* is substantially flat. Preferably, planarization layer 62 is a material such as polyimide, spin-on glass, or any other suitable protective material which can be applied to a uniform depth over surface 60*a* of conducting layer 60.

Figure 16:
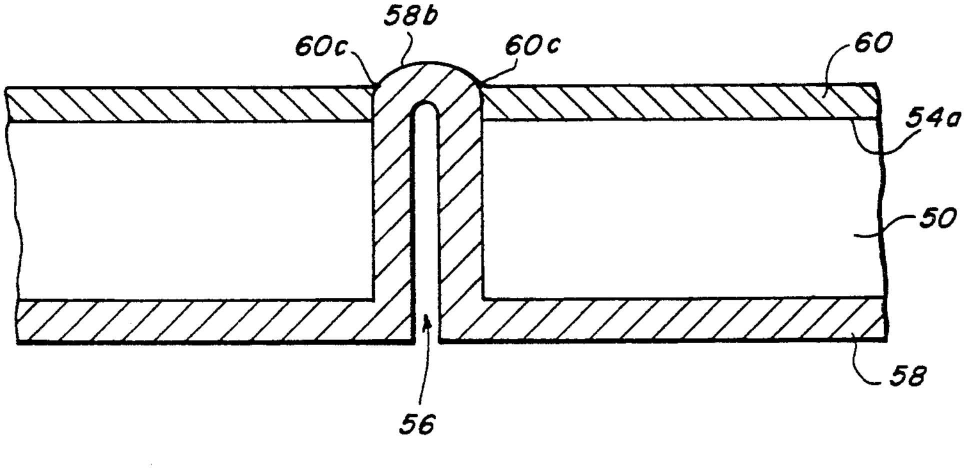

Layer 62 is then etched to expose a portion 60*b* of layer 60. Preferably, etching is performed using, for example, planar plasma etching, wet etching or reactive ion etching. Selective etching is then performed to remove the exposed portion 60*b* of layer 60 to expose a second portion 58*b* of layer 58, as shown in FIG. 16.

Figure 17:
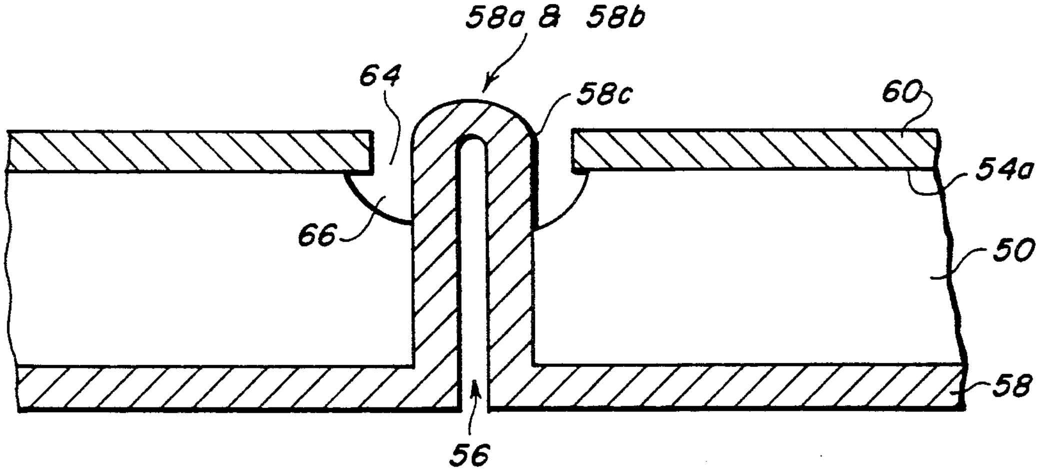

Selective etching is then performed to remove additional edge portions 60*c* of second conducting layer 60 adjacent to first conducting layer 58 and second portion 58*b* of layer 58, thereby forming an aperture 64 and exposing a third portion 58*c* of layer 58. Further selective etching is then performed to remove additional portions of substrate 50 adjacent to layer 58 and third portion 58*c* of layer 58. These two etching steps provide an insulative space 66 between layer 60 and layer 58, which exposes a third portion 58*c* of layer 58, as shown in FIG. 17.

Figure 18:
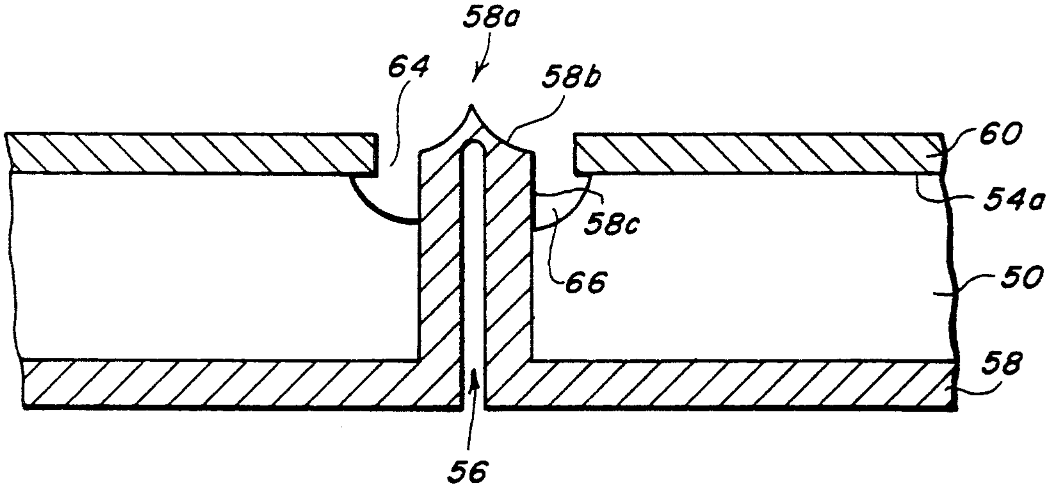

Further selective and sharpening etching, e.g., field dependent wet etching, anisotropic etching or sharpening by sputtering etching, is performed to sharpen portion 58*a* of layer 58 into a field emitter tip, as shown in FIG. 18. It will be appreciated that the sharpening step resulting in the structure shown in FIG. 18 advantageously can be performed prior to deposition of second conducting layer 60.

A field emitter array formed in accordance with the invention is low in cost because of the minimum number of masking and developing steps employed. In addition, the fabrication method is self-aligning, since the field emitter is formed, for example, by depositing first conducting layer 22 along the inside of hole 18 on surface of substrate 10 and then removing a portion of substrate 10 from the opposite surface. Thus, the resulting gate structure is always oriented on the portions of first conducting layer 22 protruding above second surface 21*a* of substrate 10. This eliminates masking steps and consequently eliminates mask alignment steps for the various masks normally used in conventional fabrication methods.

A field emitter array formed according to the invention can also be produced so as to operate in a specific voltage range. Since the size of aperture 30 is controlled by the etching time of the final etching and undercutting steps, the separation between the circumference of aperture 30 and apex 20 can be precisely controlled. In addition, since second conducting layer 26 is deposited over a uniform surface, the resulting aperture 30 is advantageously smooth, flat and uniform. Controlling both the size and the edge structure of aperture 30 results in a field emitter array which operates at a known applied voltage level.

In addition, the field emitter array thus formed is more resistant to electrical damage because the substrate 10 starts as a semi-insulating single crystal without structural defects. Without the normally encountered pin-holes, cracks and other flaws typically created during fabrication, the field emitter array is less likely to fail from voltage breakdown caused by defects or electrical and thermal stresses.

Other modifications and variations to the invention will be apparent to those skilled in the art from the foregoing disclosure teachings. Thus, while only certain embodiments of the invention have been specifically described herein, it will be apparent that numerous modifications may be made thereto without departing from the spirit and scope of the invention.

What is claimed is:

1. A field emitter array comprising:

a substrate made of a single crystal material having first and second surfaces and having at least one hole with a plurality of sides which intersect at a crystallographically sharp apex;

an electron emitter comprising a first conducting layer conforming to said first surface and said sides of said at least one hole and filling said apex;

a gate comprising a second conducting layer conforming to said second surface; and an aperture comprising at least one bore in said substrate, said bore intersecting said gate and a predetermined portion of said electron emitter.

2. The field emitter array of claim 1, wherein said substrate comprises a substrate made from a material selected from the group consisting of GaAs, InP, GaP, $SiO_2$, $Si_3N_4$, $Al_2O_3$ and combinations thereof.

3. The field emitter array of claim 1, wherein said first and second surfaces are disposed substantially parallel to one another.

4. A field emitter structure comprising:

a substrate selected from the group consisting of a semi-insulating substrate and an insulating substrate, said substrate having first and second surfaces and at least one hole therethrough;

a first conducting layer disposed on said first surface of said substrate and having at least one aperture aligned with an associated said at least one hole in said substrate, said at least one aperture of said first conducting layer comprising an extraction electrode; and a second conducting layer disposed on said second surface and projecting into said at least one hole in said substrate and into said at least one associated aperture of said first conducting layer and forming at least one associated apex inside said at least one hole, said at least one associated apex comprising an associated electron field emitter.

5. The field emitter structure of claim 4 wherein: said substrate is made of a single crystal material.

6. The field emitter structure of claim 4 wherein: said substrate is made of a material selected from the group consisting of GaAs, InP, GaP, $SiO_2$, $Si_3N_4$, $Al_2O_3$ and combinations thereof.

7. A field emitter structure comprising:

a conductive substrate having first and second surfaces and at least one hole therethrough;

a first insulating layer disposed on said first surface of said substrate and having at least one aperture aligned with an associated said at least one hole in said substrate;

a first conducting layer disposed on said first insulating layer and having at least one aperture aligned with an associated said at least one aperture in said first insulating layer, said first conducting layer comprising an extraction electrode; and a second conducting layer disposed on said second surface and projecting into said at least one hole in said substrate, into said at least one associated aperture of said first insulating layer, and into said associated at lest one associated aperture of said first conducting layer, and forming at least one associated apex inside said at least one hole in said conducting substrate, said at least one associated apex comprising an associated electron field emitter.

* * * * *